(12) United States Patent
Shin et al.

(10) Patent No.: US 12,503,648 B2
(45) Date of Patent: Dec. 23, 2025

(54) METHOD AND SYSTEM FOR TREATING SURFACES OF SUBSTRATE

(71) Applicant: S.E.A. Co., Ltd., Gumi-si (KR)

(72) Inventors: Jaeho Shin, Gumi-si (KR); Jeonghwan Kim, Gumi-si (KR)

(73) Assignee: S.E.A. Co., Ltd., Gumi-si (KR)

( * ) Notice: Subject to any disclaimer, the term of this patent is extended or adjusted under 35 U.S.C. 154(b) by 267 days.

(21) Appl. No.: 18/087,692

(22) Filed: Dec. 22, 2022

(65) Prior Publication Data
US 2024/0076549 A1 Mar. 7, 2024

(30) Foreign Application Priority Data

Sep. 7, 2022 (KR) .......................... 10-2022-0113568

(51) Int. Cl.
| | | |
|---|---|---|
| C09K 13/04 | (2006.01) | |
| H01L 21/02 | (2006.01) | |
| H01L 21/306 | (2006.01) | |
| H01L 21/3213 | (2006.01) | |
| H01L 21/67 | (2006.01) | |

(52) U.S. Cl.
CPC ........ *C09K 13/04* (2013.01); *H01L 21/02019* (2013.01); *H01L 21/02021* (2013.01); *H01L 21/02068* (2013.01); *H01L 21/02087* (2013.01); *H01L 21/30604* (2013.01); *H01L 21/32134* (2013.01); *H01L 21/6704* (2013.01); *H01L 21/67086* (2013.01); *H01L 21/6715* (2013.01)

(58) Field of Classification Search
None
See application file for complete search history.

(56) References Cited

U.S. PATENT DOCUMENTS 6,482,749 B1 * 11/2002 Billington ......... H01L 21/02021
257/E21.309
2012/0234793 A1 9/2012 Schmid

FOREIGN PATENT DOCUMENTS

KR 1020130116504 B1 10/2013

OTHER PUBLICATIONS

M. Firat et al., "Large area bifacial n-TOPCon solar cell with in-situ phosphorus-doped LPCVD poly-Si passivating contacts", Solar Energy Materials & Solar Cells, vol. 236, paper# 111544. (Year: 2022).*

* cited by examiner

*Primary Examiner* — Jiong-Ping Lu
(74) *Attorney, Agent, or Firm* — Youngil Lee

(57) ABSTRACT

Disclosed herein are a method and system for treating surfaces of a substrate. According to an embodiment, there is provided a method for treating surfaces of a substrate, the method including: removing an oxide film on the side surfaces or bottom surface of a substrate by using an acidic solution, contained in an acid bath, in the acid bath; applying a protective liquid to the top surface of the substrate, from which the oxide film has been removed, in a protective liquid application zone; and removing a wrap-around layer on the side surfaces or edges of the top surface of the substrate coated with the protective liquid by using an alkaline solution, contained in an alkali bath, in the alkali bath.

13 Claims, 5 Drawing Sheets

METHOD AND SYSTEM FOR TREATING SURFACES OF SUBSTRATE

CROSS-REFERENCE TO RELATED APPLICATIONS

This application claims the right of priority to and the benefits of Korean Patent Application No. 10-2022-0113568 filed on Sep. 7, 2022, which is hereby incorporated by reference herein in its entirety.

BACKGROUND

1. Technical Field

The following embodiments relate to a method and system for treating surfaces of a substrate.

2. Description of the Related Art

A process of manufacturing a semiconductor device consists of the processes of forming and stacking patterns on a substrate in tens of different types of layers according to pre-designed circuit patterns. As an example, amorphous silicon (a-Si) may be deposited on the bottom surface of a substrate to form an amorphous silicon layer.

A technology for forming and stacking patterns in different layers of a substrate to manufacture a semiconductor device as described above is disclosed in Korean Patent Application Publication No. 10-2013-0116504.

However, as shown in FIG. 1 illustrating a wrap-around layer, amorphous silicon may also be deposited on the side surfaces or edges of the top surface of a substrate in the process of being deposited on the bottom surface of the substrate, so that a wrap-around layer made of amorphous silicon may be formed on the side surfaces or edges of the top surface of the substrate.

As an unintended result of a designed circuit pattern, such a wrap-around layer may optically damage the side surfaces or edges of the top surface of a substrate or may functionally damage a semiconductor device to be implemented by the substrate.

Therefore, there is a need to propose a technology for removing the described wrap-around layer.

However, in the process of removing a wrap-around layer, the condition must be satisfied that an emitter layer located under a protection layer (PSG or BSG) is not damaged.

SUMMARY

Embodiments propose a method and system for treating surfaces of a substrate that selectively perform alkaline etching on a wrap-around layer using a protective liquid in order to remove the wrap-around layer while satisfying the condition that an emitter layer is prevented from being damaged.

In this case, embodiments propose a method and system for treating surfaces of a substrate that apply a protective liquid in a protective liquid application zone separate from an alkali bath in which alkaline etching is performed in order to prevent the protective liquid from being mixed with an alkaline solution during an alkaline etching process.

Furthermore, embodiments propose a method and system for treating surfaces of a substrate that apply a protective liquid in a protective liquid application zone, which is an empty space that does not occupy space upstream of an alkali bath, in order to prevent the problem of pushing components in front or back thereof due to the expansion of the alkali bath as alkaline etching proceeds as a high-temperature process.

Furthermore, embodiments propose a method and system for treating surfaces of a substrate that remove an oxide film on the surfaces of a substrate before alkaline etching in order to prevent the problem in which an oxide film formed on the surfaces of the substrate after annealing delays the reaction rate of alkaline etching.

Moreover, embodiments propose a method and system for treating surfaces of a substrate that apply a protective liquid to the top surface of a substrate before the removal of an oxide film and replenish the protective liquid on the top surface of the substrate in a protective liquid application zone after the removal of an oxide film in order to prevent the phenomenon in which the protective liquid on the top surface of the substrate is evaporated and reduced as alkaline etching proceeds as a high-temperature process.

However, the objects of the present invention are not limited to the above-described objects, and may be variously expanded without departing from the technical spirit and scope of the present invention.

According to an aspect of the present invention, there is provided a method for treating surfaces of a substrate, the method including: removing an oxide film on the side surfaces or bottom surface of a substrate by using an acidic solution, contained in an acid bath, in the acid bath; applying a protective liquid to the top surface of the substrate, from which the oxide film has been removed, in a protective liquid application zone; and removing a wrap-around layer on the side surfaces or edges of the top surface of the substrate coated with the protective liquid by using an alkaline solution, contained in an alkali bath, in the alkali bath.

Applying the protective liquid may include removing the protective liquid applied to the edges of the top surface of the substrate and maintaining the protective liquid applied to the remaining area of the top surface of the substrate based on the characteristics in which the edges of the top surface of the substrate have hydrophobic property and the remaining area of the top surface of the substrate has hydrophilic property.

The method may further include, before applying the protective liquid, performing pre-treatment that converts the substrate having hydrophilic property so that the edges of the top surface of the substrate have hydrophobic property.

Removing the wrap-around layer may include performing alkaline etching on the wrap-around layer on the side surfaces or edges of the top surface of the substrate as the protective liquid is removed from the edges of the top surface of the substrate while the protective liquid is maintained on the remaining area of the top surface of the substrate.

Applying the protective liquid and removing the wrap-around layer may be repeatedly performed as the protective liquid application zone includes a plurality of protective liquid application zones, the alkali bath includes a plurality of alkali baths, and the protective liquid application zones and the alkali baths are alternately arranged.

Removing the oxide film may include applying a protective liquid to the top surface of the substrate.

Removing the oxide film may include removing the acidic solution remaining on the substrate after removing the oxide film.

According to another aspect of the present invention, there is provided a system for treating surfaces of a substrate, the system including: an acid bath configured to remove an oxide film on the side surfaces or bottom surface of a substrate by using a contained acidic solution; a protective liquid application device configured to apply a protective liquid to the top surface of the substrate, from which the oxide film has been removed, in a protective liquid application zone; and an alkali bath configured to remove a wrap-around layer on the side surfaces or edges of the top surface of the substrate coated with the protective liquid by using a contained alkaline solution.

The system may remove the protective liquid applied to the edges of the top surface of the substrate and maintain the protective liquid applied to the remaining area of the top surface of the substrate based on the characteristics in which the edges of the top surface of the substrate have hydrophobic property and the remaining area of the top surface of the substrate has hydrophilic property.

The system may, before applying the protective liquid, perform pre-treatment that converts the substrate having hydrophilic property so that the edges of the top surface of the substrate have hydrophobic property.

The alkali bath may perform alkaline etching on the wrap-around layer on the side surfaces or edges of the top surface of the substrate as the protective liquid is removed from the edges of the top surface of the substrate while the protective liquid is maintained on the remaining area of the top surface of the substrate.

Applying the protective liquid and removing the wrap-around layer may be repeatedly performed as the protective liquid application zone includes a plurality of protective liquid application zones, the alkali bath includes a plurality of alkali baths, and the protective liquid application zones and the alkali baths are alternately arranged.

The system may further include a cleaning device configured to remove the acidic solution remaining on the substrate in a cleaning zone after removing the oxide film.

According to still another aspect of the present invention, there is provided a method for treating surfaces of a substrate, the method including: removing an oxide film on the side surfaces or bottom surface of a substrate by using an acidic solution, contained in an acid bath, in the acid bath; cleaning the substrate by using a cleaning liquid in a cleaning zone in order to remove the acidic solution remaining on the substrate; and removing a wrap-around layer on the side surfaces or edges of the top surface of the cleaned substrate by using an alkaline solution, contained in an alkali bath, in the alkali bath.

Cleaning the substrate may include removing the cleaning liquid applied to the edges of the top surface of the substrate and maintaining the cleaning liquid applied to a remaining area of the top surface of the substrate based on the characteristics in which the edges of the top surface of the substrate have hydrophobic property and the remaining area of the top surface of the substrate has hydrophilic property.

The method may further include, before cleaning the substrate, performing pre-treatment that converts the substrate having hydrophilic property so that the edges of the top surface of the substrate have hydrophobic property.

Removing the wrap-around layer may include performing alkaline etching on the wrap-around layer on the side surfaces or edges of the top surface of the substrate as the cleaning liquid is removed from the edges of the top surface of the substrate while the cleaning liquid is maintained on the remaining area of the top surface of the substrate.

The method may further include, after removing the wrap-around layer, applying a protective solution to the top surface of the substrate, in which the wrap-around layer is removed and the bottom surface thereof is in a wet state, in a protective liquid application zone.

Removing the wrap-around layer and applying the protective liquid may be repeatedly performed as the alkali bath includes a plurality of alkali baths, the protective liquid application zone includes a plurality of protective liquid application zones, and the protective liquid application zones and the alkali baths are alternately arranged.

Removing the oxide film may include applying a protective liquid to the top surface of the substrate.

According to still another aspect of the present invention, there is provided a system for treating surfaces of a substrate, the system including: an acid bath configured to remove an oxide film on the side surfaces or bottom surface of a substrate by using a contained acidic solution; a cleaning device configured to clean the substrate by using a cleaning liquid in a cleaning zone in order to remove the acidic solution remaining on the substrate; and an alkali bath configured to remove a wrap-around layer on the side surfaces or edges of the top surface of the cleaned substrate by using a contained alkaline solution.

BRIEF DESCRIPTION OF THE DRAWINGS

The above and other objects, features, and advantages of the present invention will be more clearly understood from the following detailed description taken in conjunction with the accompanying drawings, in which.

DETAILED DESCRIPTION

Figure 1:
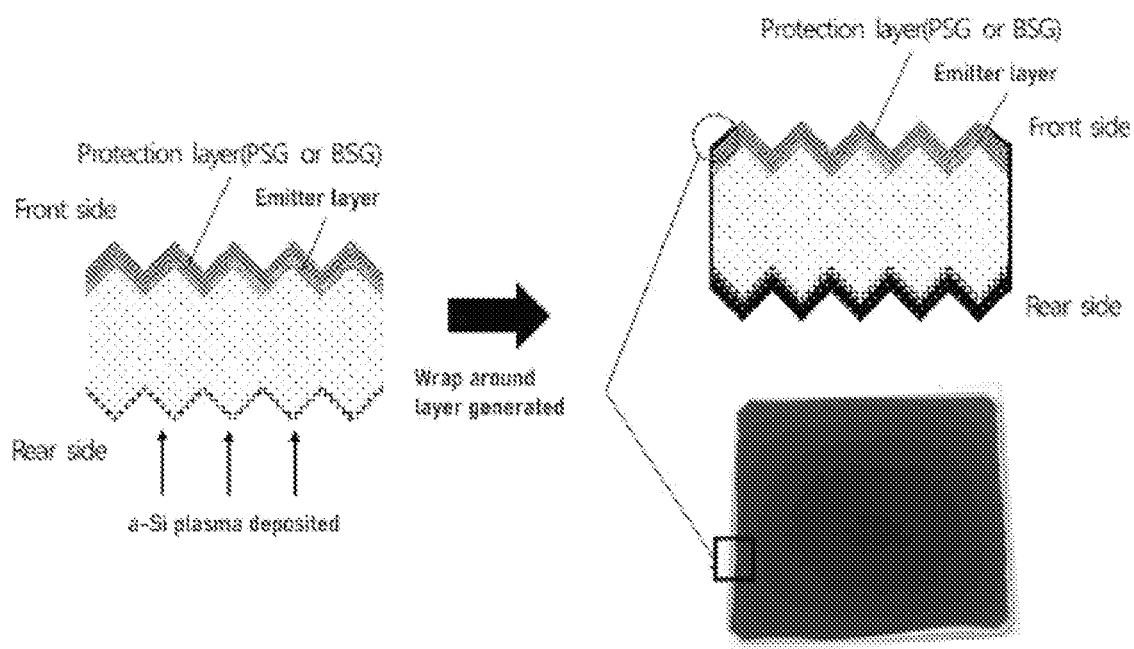
FIG. 1 is a view illustrating a wrap-around layer.

Embodiments of the present invention will be described in detail below with reference to the accompanying drawings. However, the present invention is not limited or restricted to the embodiments. Furthermore, like reference numerals denote like members throughout the drawings.

In addition, the terminology used herein corresponds to terms used to appropriately describe embodiments of the present invention, which may vary according to the intention of a viewer or operator or customs in the art to which the present invention pertains. Accordingly, definitions of these terms should be made based on the context throughout the present specification. For example, in the present specification, singular forms also include plural forms unless specifically stated otherwise. Furthermore, as used herein, the terms "include," "comprise," "including," "comprising," and the like do not exclude the presence or addition of one or more components, steps, operations, and/or elements other than referenced one or more components, steps, operations, and/or elements. In addition, although terms such as "first," "second," etc. are used in the present specification to describe various regions, directions, shapes, etc., these regions, directions, shapes, etc. should not be limited by these terms. These terms are each used merely to distinguish one area, direction or shape from another area, direction or shape. Accordingly, a portion referred to as a first portion in one embodiment may be referred to as a second portion in another embodiment.

Furthermore, it should be understood that various embodiments of the present invention are different from each other but are not necessarily mutually exclusive. For example, the specific shapes, structures, and/or characteristics of one embodiment described herein may be implemented in another embodiment without departing from the spirit and scope of the present invention. In addition, it should be understood that the locations, arrangements, and/or configurations of individual components presented in the scope of each embodiment may be changed without departing from the spirit and scope of the present invention.

Methods and systems for treating surfaces of a substrate to embodiments will be described in detail below with reference to the accompanying drawings.

Figure 2:
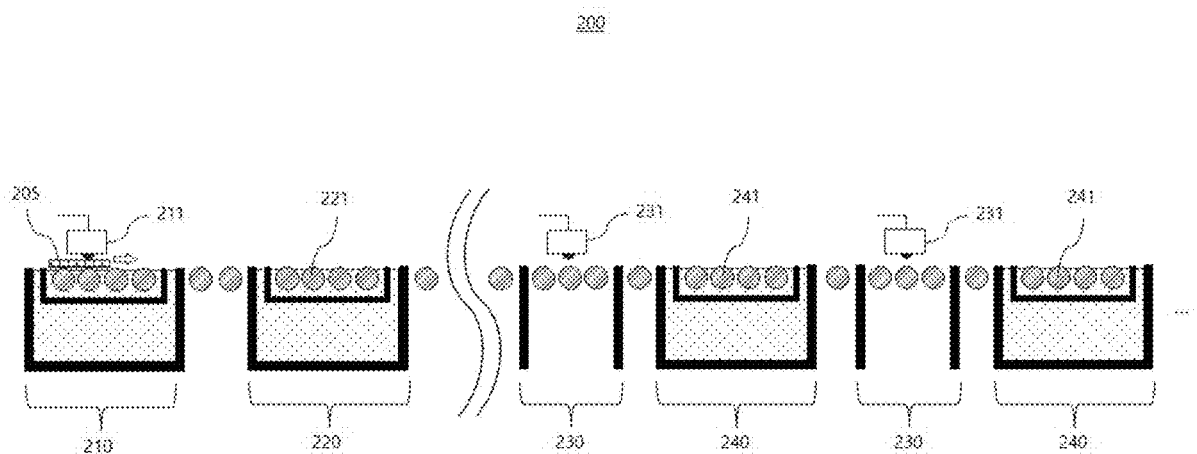
FIG. 2 is a diagram showing a system for treating surfaces of a substrate according to an embodiment.
Figure 3:
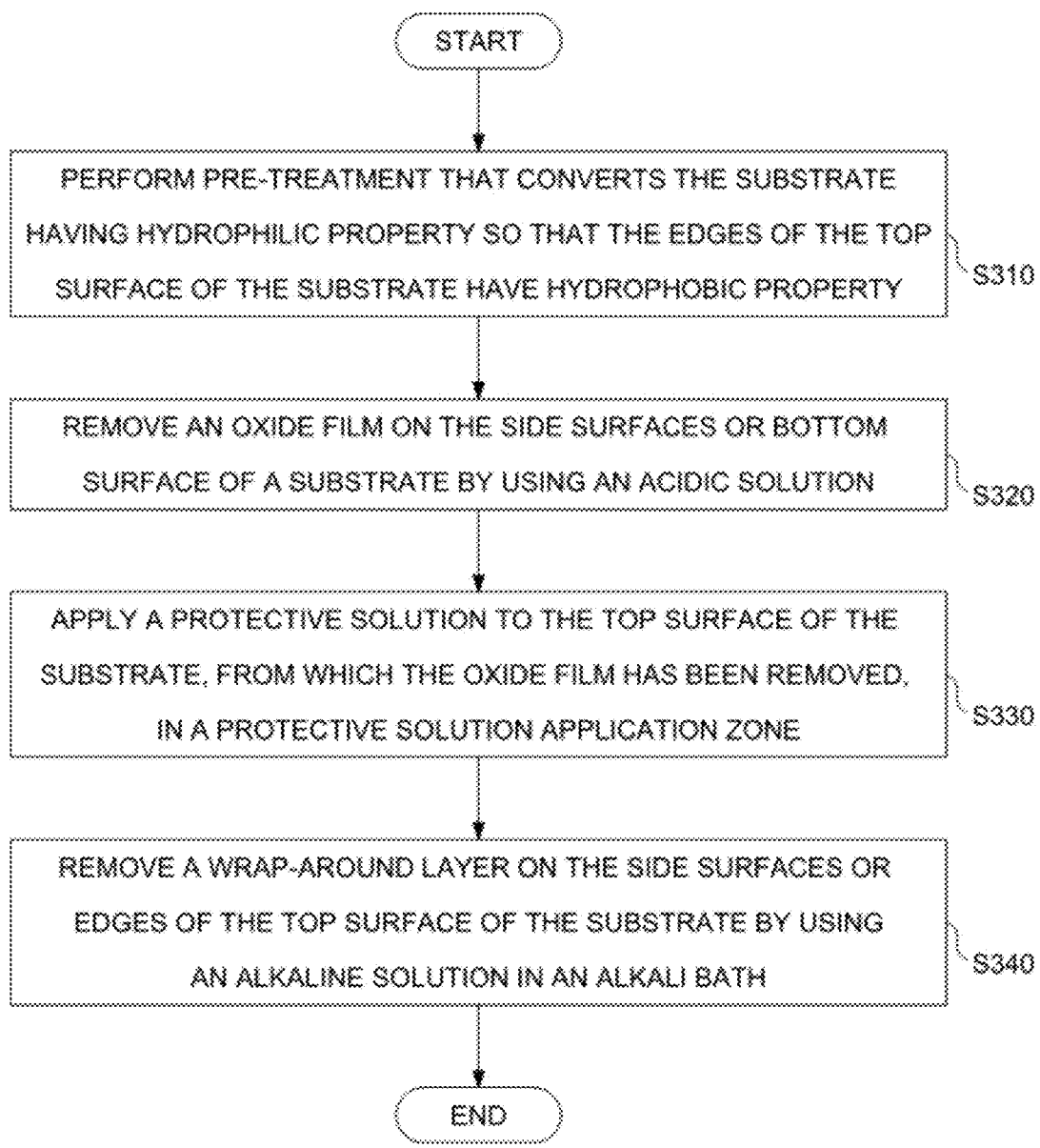
FIG. 3 is a flowchart showing a method for treating surfaces of a substrate performed by the system for treating surfaces of a substrate shown in FIG. 2.

FIG. 2 is a diagram showing a system for treating surfaces of a substrate according to an embodiment, and FIG. 3 is a flowchart showing a method for treating surfaces of a substrate performed by the system for treating surfaces of a substrate shown in FIG. 2. Hereinafter, agents that perform the method for treating surfaces of a substrate may be components that constitute the system for treating surfaces of a substrate shown in FIG. 2.

Referring to FIGS. 2 and 3, the system 200 for treating surfaces of a substrate may include a pretreatment device 211 provided in a pretreatment zone 210, an acid bath 220, and protective liquid application devices 231 provided in protective liquid application zones 230, and alkali baths 240. Accordingly, as a substrate 205 sequentially passes through the pretreatment zone 210, the acid bath 220, the protective liquid application zone 230, the alkali bath 240, the protective liquid application zone 230, the alkali bath 240 and so forth, corresponding processes may be performed in the zones and the baths.

In step S310, the system 200 for treating surfaces of a substrate may perform pre-treatment that converts the substrate 205 having hydrophilic property in the pretreatment zone 210 so that the edges of the top surface of the substrate 205 have hydrophobic property before a protective liquid is applied. As an example, the pretreatment device 211, such as a nozzle, a brush, an idle roller or the like, provided in the pretreatment zone 210 may perform pretreatment using surface tension so that only the edges of the top surface of the hydrophilic substrate 205 have hydrophobic property.

In step S320, the system 200 for treating surfaces of a substrate may remove an oxide film on the side surfaces or bottom surface of the substrate 205 using an acidic solution, contained in the acid bath 220, in the acid bath 220. As an example, rollers 221 provided in the acid bath 220 move the substrate 205 while soaking the side surfaces or bottom surface of the substrate 205 in the acidic solution contained in the acid bath 220, thereby performing acidic etching on an oxide film on the side surfaces or bottom surface of the substrate 205.

In this case, the system 200 for treating surfaces of a substrate may apply a protective liquid to the top surface of the substrate 205 while performing acidic etching on an oxide film. For example, a protective liquid application device (not shown), such as a nozzle, a brush, an idle roller or the like, provided in the acid bath 220 may apply a protective liquid to the top surface of the substrate 205 at the same time that the rollers 221 perform acidic etching on an oxide film on the side surfaces or bottom surface of the substrate 205 in the acid bath 220. Water, PEG or phosphoric acid may be used as the protective solution. When the protective liquid application device is composed of a nozzle, the nozzle may automatically apply the protective liquid to the substrate 205 passing by in an open state at all times.

In this case, after the oxide film has been removed in step S320, the system 200 for treating surfaces of a substrate removes the acidic solution remaining on the substrate 205 in a cleaning zone (not shown) disposed downstream of the acid bath 220. For example, a cleaning device (not shown), such as a nozzle, a brush, an idle roller or the like, provided in the cleaning zone may remove the acidic solution remaining on the substrate 205 from which the oxide film has been removed. Although the cleaning zone may be an empty zone that does not occupy space, it is not limited thereto, but may refer to a cleaning bath. Water may be used as the cleaning liquid. When the cleaning device is composed of a nozzle, the nozzle may automatically apply and spray the cleaning liquid to the substrate 205 passing by in an open state at all times.

In step S330, the system 200 for treating surfaces of a substrate may apply a protective liquid to the top surface of the substrate 205, from which the oxide film has been removed, in the protective liquid application zone 230. More specifically, the protective liquid application device 231, such as a nozzle, a brush, an idle roller or the like, provided in the protective liquid application zone 230 may apply the protective liquid to the top surface of the substrate 205 from which the oxide film has been removed. Although the protective liquid application zone 230 may be an empty zone that does not occupy space, it is not limited thereto, but may also refer to a protective liquid application bath. When the protective liquid application device 231 is composed of a nozzle, the nozzle may automatically apply and spray an alkali protective liquid to the substrate 205 passing by in an open state at all times.

Through the pretreatment process described above, the edges of the top surface of the substrate 205 have hydrophobic property, and the remaining area (the central area exclusive of the edges) of the top surface of the substrate 205 has hydrophilic property. Accordingly, while the protective liquid applied to the remaining area of the top surface of the substrate 205 may be maintained, the protective liquid applied to the edges of the top surface of the substrate 205 may be removed while flowing away from the edges of the top surface of the substrate 205.

In other words, in step S330, the system 200 for treating surfaces of a substrate may remove the protective liquid applied to the edges of the top surface of the substrate 205 and maintain the protective liquid applied to the remaining area of the top surface of the substrate 205 based on the characteristics in which the edges of the top surface of the substrate 205 have hydrophobic property and the remaining area of the top surface of the substrate 205 has hydrophilic property. The protective liquid applied to the edges of the top surface of the substrate 205 is removed in the protective liquid application zone 230, so that the protective liquid can be prevented from falling into the alkali bath 240.

In step S340, the system 200 for treating surfaces of a substrate may remove a wrap-around layer on the side surfaces or edges of the top surface of the substrate 205 coated with the protective liquid using the alkaline solution, contained in the alkali bath 240, in the alkali bath 240. More specifically, rollers 241 provided in the alkali bath 240 move the substrate 205 while soaking the side surfaces or edges of the top surface of the substrate 205 in the alkaline solution contained in the alkali bath 240, thereby performing alkaline etching on the wrap-around layer on the side surfaces or edges of the top surface of the substrate 205. As described above, while the protective liquid is removed from the edges of the top surface of the substrate 205, the protective liquid may remain on the remaining area of the top surface of the substrate 205. The system 200 for treating surfaces of a substrate may selectively perform alkaline etching only on the edges of the top surface of the substrate 205 that are not protected with the protective liquid, exclusive of the remaining area of the top surface of the substrate 205 that is protected with the protective liquid, using the above characteristics. The temperature condition of the alkaline etching process may be 65° C. to 85° C.

As shown in the drawing, as the plurality of protective liquid application zones 230 and the plurality of alkali baths 240 are alternately arranged, the system 200 for treating surfaces of a substrate may repeatedly perform step S330 of applying the protective liquid and step S340 of removing the wrap-around layer. However, the present invention is not limited or restricted thereto. Since only one protective liquid application zone 230 and one alkali bath 240 may be provided, step S330 of applying the protective liquid and step S340 of removing the wrap-around layer may be performed once.

Figure 4:
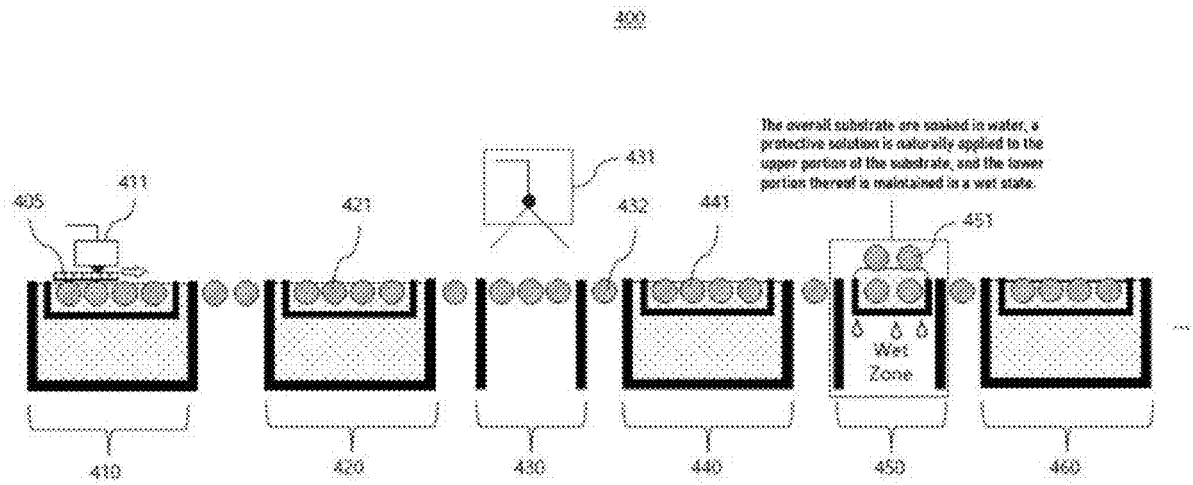
FIG. 4 is a diagram showing a system for treating surfaces of a substrate according to another embodiment.
Figure 5:
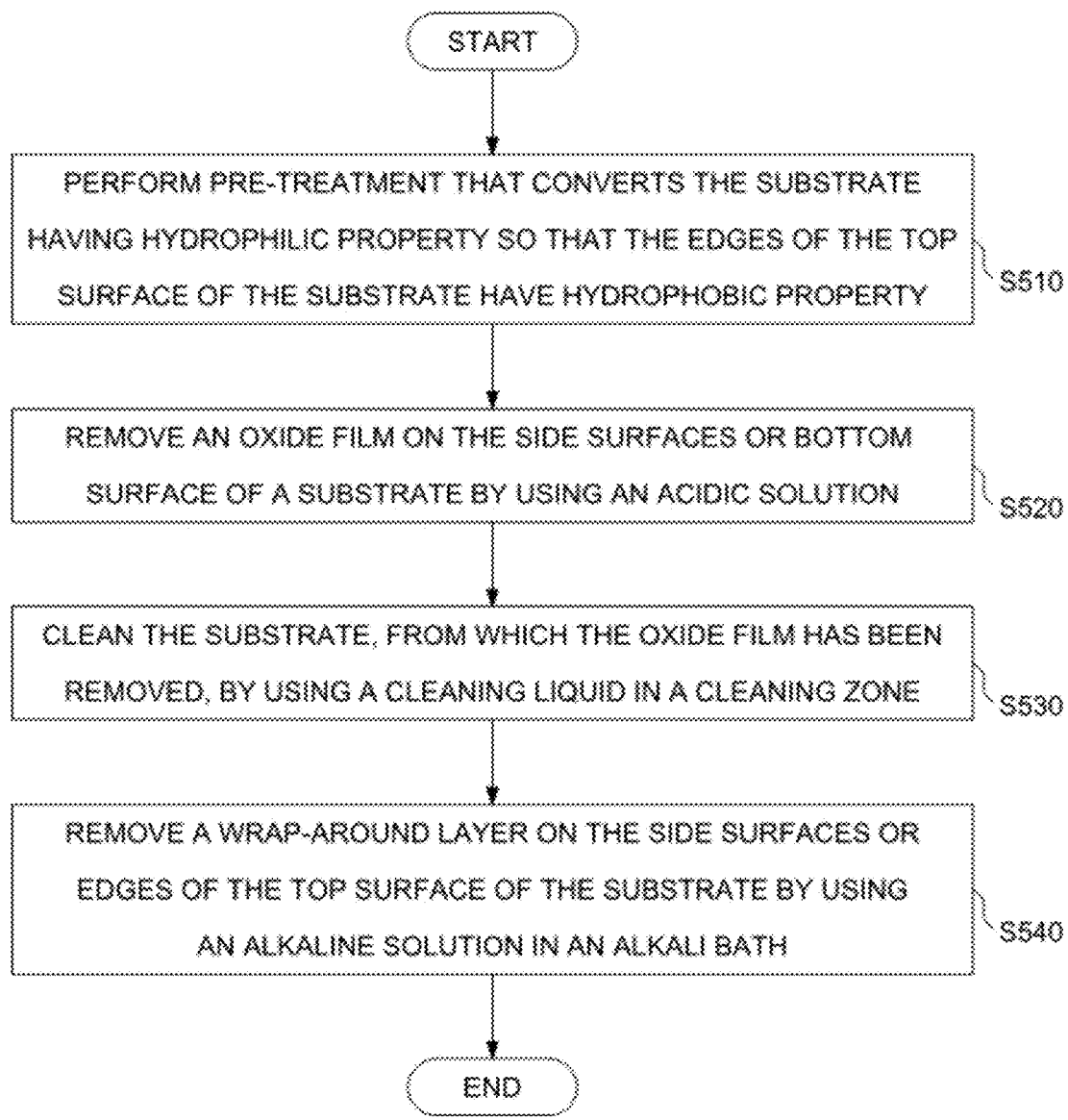
FIG. 5 is a flowchart showing a method for treating surfaces of a substrate performed by the system for treating surfaces of a substrate shown in FIG. 4.

FIG. 4 is a diagram showing a system for treating surfaces of a substrate according to another embodiment, and FIG. 5 is a flowchart showing a method for treating surfaces of a substrate performed by the system for treating surfaces of a substrate shown in FIG. 4. Hereinafter, agents that perform the method for treating surfaces of a substrate may be components that constitute the system for treating surfaces of a substrate shown in FIG. 4.

Referring to FIGS. 4 and 5, the system 400 for treating surfaces of a substrate may include a pretreatment device 411 provided in a pretreatment zone 410, an acid bath 420, a cleaning device 431 provided in a cleaning zone 430, and an alkali bath 440. Accordingly, as a substrate 405 sequentially passes through the pretreatment zone 410, the acid bath 420, the cleaning zone 430 and the alkali bath 440, corresponding processes may be performed in the zones and the baths.

In step S510, the system 400 for treating surfaces of a substrate may perform pre-treatment that converts the substrate 405 having hydrophilic property in the pretreatment zone 410 so that the edges of the top surface of the substrate 405 have hydrophobic property before cleaning is performed to remove an acidic solution remaining on the substrate 405. As an example, the pretreatment device 411, such as a nozzle, a brush, an idle roller or the like, provided in the pretreatment zone 410 may perform pretreatment using surface tension so that only the edges of the top surface of the hydrophilic substrate 405 have hydrophobic property.

In step S520, the system 400 for treating surfaces of a substrate may remove an oxide film on the side surfaces or bottom surface of the substrate 405 using an acidic solution, contained in the acid bath 420, in the acid bath 420. As an example, rollers 421 provided in the acid bath 420 move the substrate 405 while soaking the side surfaces or bottom surface of the substrate 405 in the acidic solution contained in the acid bath 420, thereby performing acidic etching on an oxide film on the side surfaces or bottom surface of the substrate 405.

In this case, the system 400 for treating surfaces of a substrate may apply a protective liquid to the top surface of the substrate 405 while performing acidic etching on an oxide film. For example, a protective liquid application device (not shown), such as a nozzle, a brush, an idle roller or the like, provided in the acid bath 420 may apply a protective liquid to the top surface of the substrate 405 at the same time that the rollers 421 perform acidic etching on an oxide film on the side surfaces or bottom surface of the substrate 405 in the acid bath 420. Water, PEG or phosphoric acid may be used as the protective solution. When the protective liquid application device is composed of a nozzle, the nozzle may automatically apply the protective liquid to the substrate 405 passing by in an open state at all times.

In step S530, the system 400 for treating surfaces of a substrate may clean the substrate 405 with a cleaning solution in order to remove the acidic solution remaining on the substrate 405 in the cleaning zone 430. More specifically, the cleaning device 431, such as a nozzle, a brush, an idle roller or the like, provided in the cleaning zone 430 may remove the remaining acidic solution on the substrate 405 by applying a cleaning solution to the surfaces of the substrate 405 from which the oxide film has been removed. Although the cleaning zone 430 may be an empty zone that does not occupy space, it is not limited thereto, but may refer to a cleaning bath. Water may be used as the cleaning liquid. When the cleaning device is composed of a nozzle, the nozzle may automatically apply and spray the cleaning liquid to the substrate 405 passing by in an open state at all times.

Through the pretreatment process described above, the edges of the top surface of the substrate 405 have hydrophobic property, and the remaining area (the central area exclusive of the edges) of the top surface of the substrate 405 has hydrophilic property. Accordingly, while the cleaning liquid applied to the remaining area of the top surface of the substrate 405 may be maintained, the cleaning liquid applied to the edges of the top surface of the substrate 405 may be removed while flowing away from the edges of the top surface of the substrate 405.

In other words, in step S530, the system 400 for treating surfaces of a substrate may remove the cleaning liquid applied to the edges of the top surface of the substrate 405 and maintain the cleaning liquid applied to the remaining area of the top surface of the substrate 405 based on the characteristics in which the edges of the top surface of the substrate 405 have hydrophobic property and the remaining area of the top surface of the substrate 405 has hydrophilic property. The cleaning liquid applied to the edges of the top surface of the substrate 405 is removed in the cleaning zone 430, so that the cleaning liquid can be prevented from falling into the alkali bath 440.

The bottom surface of the substrate 405 wet by the cleaning liquid may be wiped by a sponge roller 432 that is provided downstream of the cleaning zone 430.

In step S540, the system 400 for treating surfaces of a substrate may remove a wrap-around layer on the cleaned side surfaces or edges of the top surface of the substrate 405 using the alkaline solution, contained in the alkali bath 440, in the alkali bath 440. More specifically, rollers 441 provided in the alkali bath 440 move the substrate 405 while soaking the side surfaces or edges of the top surface of the substrate 405 in the alkaline solution contained in the alkali bath 440, thereby performing alkaline etching on the wrap-around layer on the side surfaces or edges of the top surface of the substrate 405. As described above, while the cleaning liquid is removed from the edges of the top surface of the substrate 405, the cleaning liquid may remain on the remaining area of the top surface of the substrate 405. The system 400 for treating surfaces of a substrate may selectively perform alkaline etching only on the edges of the top surface of the substrate 405 that are not protected with the cleaning liquid, exclusive of the remaining area of the top surface of the substrate 405 that is protected with the cleaning liquid, using the above characteristics. The temperature condition of the alkaline etching process may be 65° C. to 85° C.

As shown in the drawing, as a protective liquid application zone 450 is disposed downstream of the alkali bath 440 and one more alkali bath 460 is provided downstream of the protective liquid application zone 450, the system 400 for treating the surfaces of the substrate may apply the protective liquid to the top surface of the substrate 405 and simultaneously keep the bottom surface wet of the substrate 405 (thereby preventing the presence of unwanted crystals on the bottom surface) by moving the substrate 405 while soaking the substrate 405 in the protective liquid using upper and lower rollers 451 in the protective liquid application zone 450, and may remove the warp-around layer on the edges of the top surface of the substrate 405, coated with the protective liquid, in the alkali bath 460 provided downstream of the protective liquid application zone 450. In other words, the application of the protective liquid in the protective liquid application zone 450 may be performed on the substrate 405 whose bottom surface is in a wet state.

In addition, although not shown in the drawing, a plurality of protective liquid application zones (not shown) and alkali bathes (not shown) may be alternately arranged downstream of the alkali bath 460, with the result that the system 400 for treating surfaces of a substrate may repeatedly perform the process of applying a protective liquid and the process of removing a wrap-around layer. However, the present invention is not limited or restricted thereto. Only the components shown in the drawing and including the alkali bath 460 may be provided, so that removing the wrap-around layer after applying the protective liquid may be performed only once.

Alternately, unlike in the drawing, the protective liquid application zone 450 and the alkali bath 460 may be omitted, so that alkaline etching based on the cleaning liquid may be performed only once.

The embodiments may propose the method and system for treating surfaces of a substrate that selectively perform alkaline etching on a wrap-around layer using a protective liquid, thereby removing the wrap-around layer while satisfying the condition that an emitter layer is prevented from being damaged.

In this case, the embodiments may propose the method and system for treating surfaces of a substrate that apply a protective liquid in the protective liquid application zone separate from the alkali bath in which alkaline etching is performed, thereby preventing the protective liquid from being mixed with an alkaline solution during an alkaline etching process.

Furthermore, the embodiments may propose the method and system for treating surfaces of a substrate that apply a protective liquid in the protective liquid application zone, which is an empty space that does not occupy space upstream of the alkali bath, thereby preventing the problem of pushing the components in front or back thereof due to the expansion of the alkali bath as alkaline etching proceeds as a high-temperature process.

Furthermore, the embodiments may propose the method and system for treating surfaces of a substrate that remove an oxide film on the surfaces of a substrate before alkaline etching, thereby preventing the problem in which an oxide film formed on the surfaces of the substrate after annealing delay the reaction rate of alkaline etching.

Moreover, the embodiments may propose the method and system for treating surfaces of a substrate that apply a protective liquid to the top surface of a substrate before the removal of an oxide film and replenish the protective liquid on the top surface of the substrate in the protective liquid application zone after the removal of the oxide film, thereby preventing the phenomenon in which the protective liquid on the top surface of the substrate is evaporated and reduced as alkaline etching proceeds as a high-temperature process.

However, the effects of the present invention are not limited to the above-described effects, and may be variously expanded without departing from the technical spirit and scope of the present invention.

Although the embodiments have been described in conjunction with the limited examples and drawings, those skilled in the art may make various modifications and alterations from the foregoing description. For example, even when the described techniques are performed in an order different from that of the method described, and/or the components of the described system, structure, device, circuit, or the like are combined or coupled in a form different from that of the method described or are replaced or substituted by other components or equivalents, appropriate results may be achieved.

Therefore, other implementations, other embodiments, and equivalents of the claims fall within the scope of the attached claims.

The invention claimed is:

1. A method for treating surfaces of a substrate, the method comprising:
    removing an oxide film on side surfaces or a bottom surface of a substrate by using an acidic solution, contained in an acid bath, in the acid bath;
    applying a protective liquid to a top surface of the substrate, from which the oxide film has been removed, in a protective liquid application zone; and
    removing a wrap-around layer on the side surfaces or edges of the top surface of the substrate coated with the protective liquid by using an alkaline solution, contained in an alkali bath, in the alkali bath.

2. The method of claim 1, wherein applying the protective liquid comprises removing the protective liquid applied to the edges of the top surface of the substrate and maintaining the protective liquid applied to a remaining area of the top surface of the substrate based on characteristics in which the edges of the top surface of the substrate have hydrophobic property and the remaining area of the top surface of the substrate has hydrophilic property.

3. The method of claim 2, further comprising, before applying the protective liquid, performing pre-treatment that converts the substrate having hydrophilic property so that the edges of the top surface of the substrate have hydrophobic property.

4. The method of claim 2, wherein removing the wrap-around layer comprises performing alkaline etching on the wrap-around layer on the side surfaces or edges of the top surface of the substrate as the protective liquid is removed from the edges of the top surface of the substrate while the protective liquid is maintained on the remaining area of the top surface of the substrate.

5. The method of claim 1, wherein applying the protective liquid and removing the wrap-around layer are repeatedly performed as the protective liquid application zone includes a plurality of protective liquid application zones, the alkali bath includes a plurality of alkali baths, and the protective liquid application zones and the alkali baths are alternately arranged.

6. The method of claim 1, wherein removing the oxide film comprises applying a protective liquid to the top surface of the substrate.

7. The method of claim 1, wherein removing the oxide film comprises removing the acidic solution remaining on the substrate after removing the oxide film.

8. A method for treating surfaces of a substrate, the method comprising:
   removing an oxide film on side surfaces or a bottom surface of a substrate by using an acidic solution, contained in an acid bath, in the acid bath;
   cleaning the substrate by using a cleaning liquid in a cleaning zone in order to remove the acidic solution remaining on the substrate; and
   removing a wrap-around layer on the side surfaces or edges of a top surface of the cleaned substrate by using an alkaline solution, contained in an alkali bath, in the alkali bath,
   wherein cleaning the substrate comprises removing the cleaning liquid applied to the edges of the top surface of the substrate and maintaining the cleaning liquid applied to a remaining area of the top surface of the substrate based on characteristics in which the edges of the top surface of the substrate have hydrophobic property and the remaining area of the top surface of the substrate has hydrophilic property.

9. The method of claim 8, further comprising, before cleaning the substrate, performing pre-treatment that converts the substrate having hydrophilic property so that the edges of the top surface of the substrate have hydrophobic property.

10. The method of claim 8, wherein removing the wrap-around layer comprises performing alkaline etching on the wrap-around layer on the side surfaces or edges of the top surface of the substrate as the cleaning liquid is removed from the edges of the top surface of the substrate while the cleaning liquid is maintained on the remaining area of the top surface of the substrate.

11. A method for treating surfaces of a substrate, the method comprising:
   removing an oxide film on side surfaces or a bottom surface of a substrate by using an acidic solution, contained in an acid bath, in the acid bath;
   cleaning the substrate by using a cleaning liquid in a cleaning zone in order to remove the acidic solution remaining on the substrate; and
   removing a wrap-around layer on the side surfaces or edges of a top surface of the cleaned substrate by using an alkaline solution, contained in an alkali bath, in the alkali bath,
   wherein the method further comprises, after removing the wrap-around layer, applying a protective solution to the top surface of the substrate, in which the wrap-around layer is removed and the bottom surface thereof is in a wet state, in a protective liquid application zone.

12. The method of claim 11, wherein removing the wrap-around layer and applying the protective liquid are repeatedly performed as the alkali bath includes a plurality of alkali baths, the protective liquid application zone includes a plurality of protective liquid application zones, and the protective liquid application zones and the alkali baths are alternately arranged.

13. A method for treating surfaces of a substrate, the method comprising:
   removing an oxide film on side surfaces or a bottom surface of a substrate by using an acidic solution, contained in an acid bath, in the acid bath;
   cleaning the substrate by using a cleaning liquid in a cleaning zone in order to remove the acidic solution remaining on the substrate; and
   removing a wrap-around layer on the side surfaces or edges of a top surface of the cleaned substrate by using an alkaline solution, contained in an alkali bath, in the alkali bath,
   wherein removing the oxide film comprises applying a protective liquid to the top surface of the substrate.

* * * * *